US006995985B2

(12) United States Patent
Wu et al.

(10) Patent No.: US 6,995,985 B2
(45) Date of Patent: Feb. 7, 2006

(54) POWER PLANE REGION OF PRINTED CIRCUIT BOARD WITH POWER BLOCKS HAVING AN ARC-SHAPED BOUNDARY

(75) Inventors: Ming-Chou Wu, Hsin-Tien (TW); Chi-Te Tai, Hsin-Tien (TW); Ming-Wei Huang, Hsin-Tien (TW); Jeng-Yuan Chang, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 276 days.

(21) Appl. No.: 10/249,749

(22) Filed: May 5, 2003

(65) Prior Publication Data

US 2003/0223208 A1    Dec. 4, 2003

(30) Foreign Application Priority Data

Jun. 4, 2002    (TW) ............................... 91112026 A

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................................... 361/780; 361/794
(58) Field of Classification Search ........ 361/760–764, 361/780–783, 794–795; 257/700, 723
See application file for complete search history.

(56) References Cited

U.S. PATENT DOCUMENTS

| 5,736,796 A | * | 4/1998 | Price et al. ................. 307/151 |
| 5,790,383 A | * | 8/1998 | Inagawa ..................... 361/760 |
| 5,912,809 A | * | 6/1999 | Steigerwald et al. ........ 361/780 |
| 6,058,022 A | * | 5/2000 | Gianni et al. ............... 361/794 |
| 6,137,168 A | * | 10/2000 | Kirkman ..................... 257/691 |
| 6,465,890 B1 | * | 10/2002 | Poddar et al. .............. 257/773 |
| 6,489,574 B1 | * | 12/2002 | Otaki et al. ................. 174/262 |
| 6,842,347 B2 | * | 1/2005 | Chang ......................... 361/780 |

* cited by examiner

*Primary Examiner*—Kamand Cuneo
*Assistant Examiner*—Tuan Dinh
(74) *Attorney, Agent, or Firm*—Winston Hsu

(57) ABSTRACT

A multi-layer printed circuit board includes at least a ground plane for providing a ground level, at least a signal plane having a plurality of trace regions for transmitting signals, at least a power plane region having a plurality of power blocks for individually providing a plurality of voltage levels, and at least a via for electrically connecting the trace regions with the power plane region or the ground plane. Two adjacent power blocks with different voltage levels are separated by an insulating line. The insulating line has a plurality of first insulating sectors, and a plurality of second insulating sectors for connecting two adjacent first insulating sectors when an included angle of the adjacent first insulating sectors is greater than a predetermined value.

19 Claims, 7 Drawing Sheets

US 6,995,985 B2

POWER PLANE REGION OF PRINTED CIRCUIT BOARD WITH POWER BLOCKS HAVING AN ARC-SHAPED BOUNDARY

BACKGROUND OF INVENTION

1. Field of the Invention

The invention relates to a power plane of a multi-layer printed circuit board and more particularly, to power plane regions disposed on multi-layer printed circuit boards.

2. Description of the Prior Art

Generally, printed circuit boards (PCBs) are widely used to electrically connect electrical devices together for transmitting signals. In the past, printed circuit boards were usually single layer. Typically, a surface of the printed circuit board has only a single signal plane. Traces regions on the signal plane are used to connect all electrical devices mounted on the signal plane, and transmit input or output signals of electrical devices. When there is a plurality of different signals among electrical devices, the signal plane needs a complex layout to smoothly transmit a huge volume of signals. However, the size of a printed circuit board and the width and length of traces regions are limited. Limited size of the PCB limits the quantity of the trace regions. For this reason, the quantity of the trace regions is limited on the single layer of PCB having a signal plane. This limitation is not conducive to complex electrical circuits. Thus multi-layer printed circuit board technology has been developed by the PCB industry to increase the total amount of signal planes.

A multi-layer printed circuit board uses an insulating layer to separate two conducting layers. Because a total size of a signal layer (both conducting layers) is increased, a quantity of mounted trace regions on the signal layer is consequently increased to connect more electrical devices and to properly define signal transmission routes among electrical devices. Accordingly, the associated semiconductor processes are improved. As well, the size of integrated circuits (ICs) is greatly reduced. An IC can include more electrical devices to achieve a plurality of different functions. As the multi-layer PCB offers more possibilities for input and output locations to an IC and more flexible signal transmission routes, more complicated ICs having greater functionality can be accommodated. Thus, we can construct a multi-layer printed circuit board to define desired trace regions.

A multi-layer printed circuit board includes plural conducting layers. The outsides of conducing planes are signal planes that include trace regions and mounting pads. The insides of the conducing planes are used as a power plane region and a ground plane for the multi-layer printed circuit board. The power plane region provides a working voltage for electrical devices on the multi-layer printed circuit board. The ground plane provides a ground reference level. Please refer to FIG. 1, FIG. 2, and FIG. 3. FIG. 1 is a diagram of a signal plane 10 of a multi-layer printed circuit board according to the prior art. FIG. 2 is a diagram of a ground plane 20 of the multi-layer printed circuit board according to the prior art. FIG. 3 is a diagram of a power plane region 30 of the multi-layer printed circuit board according to the prior art. The signal plane 10 includes plural trace regions 12, plural mounting pads 14a–14d, and plural vias (or called openings) 16a–16d. The mounting pads 14a–14d are used to connect to an electrical device 18 (such a IC). The trace regions 12 are used to electrically connect with the mounting pads 14a–14d for transmitting signals. The vias 16a–16d are used to electrically connect the signal plane 10, the ground plane 20, and the power plane region 30. In addition, the ground plane 20 includes plural vias 26b–26d. Surface 22 is a conducting metal layer disposed on the ground plane 20. The power plane region 30 includes plural power blocks 32a–32c. Each block is used to provide different voltage levels for supporting the electrical device 18. For example, the power block 32a provides a voltage level of 1 volt, the power block 32b provides a voltage level of 2 volts, and the power block 32c provides a voltage level of 3 volts.

Following is a description of the operation of the multi-layer PCB with reference to the signal plane 10, the ground plane 20, and the power plane region 30. From top to bottom, the positional relationship of each plane is the signal plane 10, the ground plane 20, and the power plane region 30. If the electrical device 18 must be provided a ground voltage from the mounting pad 14a, the mounting pad 14a must electrically connect with ground plane 20. So the trace regions 12 of signal plane 10 and the mounting pad 14a electrically connect with the ground plane 20 through the via 16a. If the electrical device 18 must be provided 3 V, 2 V, and 1 V of working voltage from the mounting pads 14b, 14c, and 14d respectively, the mounting pads 14b, 14c, and 14d must respectively individually connect with the power blocks 32c, 32b, and 32a. The mounting pad 14b electrically connects with the power block 32c through the trace regions 12, the via 16b of the signal plane 10, and the via 26b of the ground plane 20. Similarly, the mounting pad 14c electrically connects with the power block 32b through the trace regions 12, the via 16c of the signal plane 10, and the via 26c of the ground plane 20. Finally, the mounting pad 14d electrically connects with the power block 32a through the trace regions 12, the via 16d of the signal plane 10, and the via 26d of the ground plane 20. Additionally, the via 34 of the power plane region 30 can be used to transmit an input signal of the electrical device 18 of the signal plane 10, the input signal passing through the ground plane 20 and the power plane region 30 to connect with another signal plane located under the power plane region 30. Thus, a multi-layer printed circuit board according to the prior art can use plural signal planes 10 to transmit signals. Additionally, signal transmitting routes among electrical devices can be put on different signal planes 10. This can greatly reduce complexity over trace regions that are put on the same signal plane 10 of a single layer printed circuit board.

When complex transmitting signals among electrical devices is required, the construction of a multi-layer printed circuit board can use plural signal planes to define a complex trace regions layout. For example, typical computer systems are constructed of a plurality of electrical devices. The main computer devices, such as a CPU, a north bridge chip, and a memory, are mounted on the motherboard. For connecting these computer devices, the motherboard exploits the aforementioned multi-layer printed circuit board construction to solve complex trace routes among the computer devices. Because of cost, motherboards are typically four-layer boards including one first signal plane, one ground plane, one power plane region, and one second signal plane. The first signal plane includes trace regions and mounting pads, the second signal plane includes trace regions related to the first signal plane, the ground plane provides a ground reference level, and the power plane region provides plural voltage levels to support the computer devices.

Referring to FIG. 3, the insulating line 24 bounds the power blocks 32a–32c. Because the insulating line 24 is not a smooth curve, the boundaries of adjacent the power blocks 32a, 32b, and 32c include acute angles. Since adjacent power blocks 32a–32c provide different voltage levels, there is a dropout voltage among the adjacent the power blocks 32a–32c. Where the boundary forms acute angles there can exist a phenomenon of peak electrical discharge. This causes voltage levels of the power blocks 32a–32c to fluctuate. The power blocks 32a–32c working voltages to the computer devices. When these working voltages are not stable, fluctuation of signals at the high and low levels affect system stability.

SUMMARY OF INVENTION

It is therefore a primary objective of the claimed invention to provide a power plane region with power blocks having an arc-shaped boundary to solve the above-mentioned problem.

According to the claimed invention, a multi-layer printed circuit board of a computer system that having a north bridge chipset includes at least a ground plane for providing a ground reference level; at least a signal plane comprising a plurality of trace regions that are conductors for transmitting signals; at least a power plane region comprising a plurality of power blocks for providing a plurality of voltage levels, two adjacent power blocks with different voltage levels being separated by an insulating line, the insulating line comprising a plurality of first line segments, the power blocks comprising three ground blocks for electrically connecting to the north bridge chipset; and at least an opening for electrically connecting the trace regions with the power plane region or the ground plane.

It is an advantage of the claimed invention that power plane region with power blocks having an arc-shaped boundary can increase stability of power on the power plane region so that electrical devices can have stable working voltage on the signal plane.

These and other objectives of the claimed invention will not doubt become obvious to those of ordinary skill in the art after reading the following detailed description of the preferred embodiment that is illustrated in the various figures and drawings.

DETAILED DESCRIPTION

Figure 6:
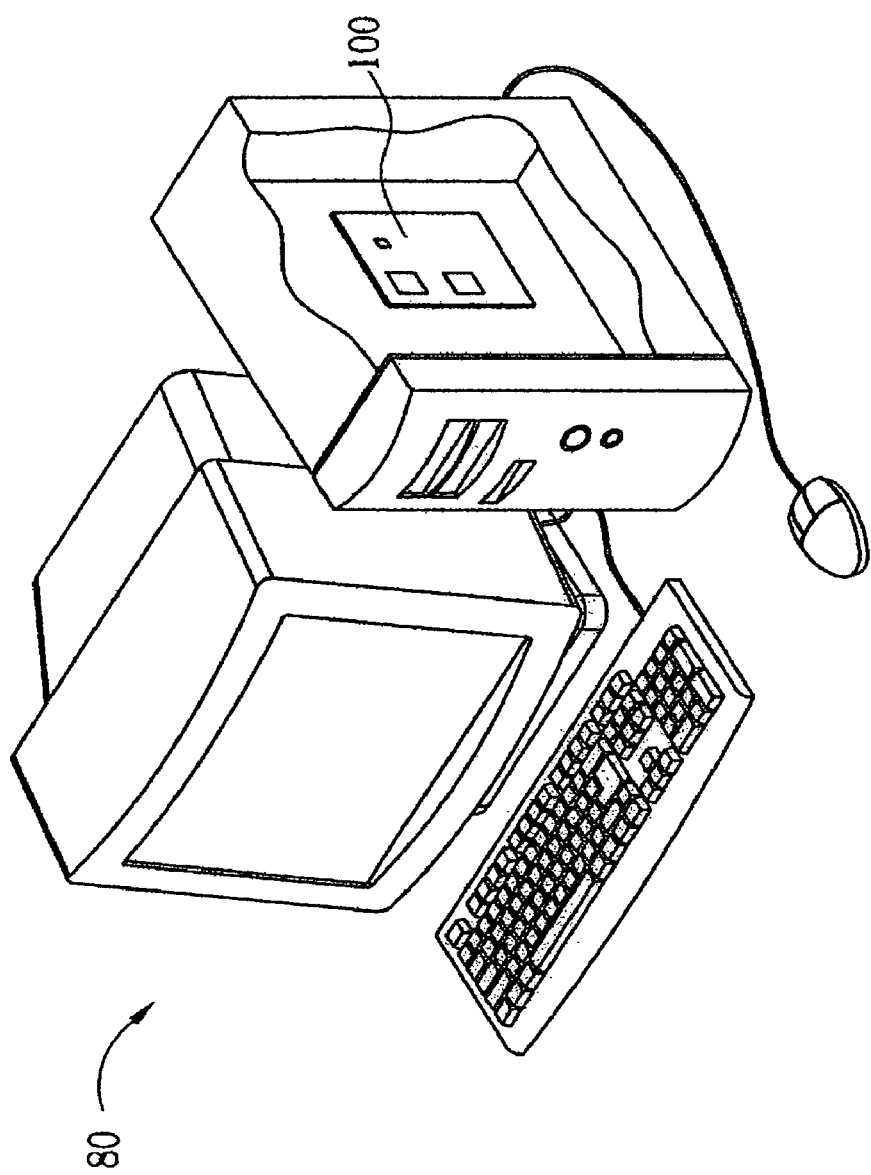
FIG. 6 is a diagram illustrating a computer system 80 containing a multi-layer printed circuit board 100 serving as a motherboard of the computer system 80.
Figure 7:
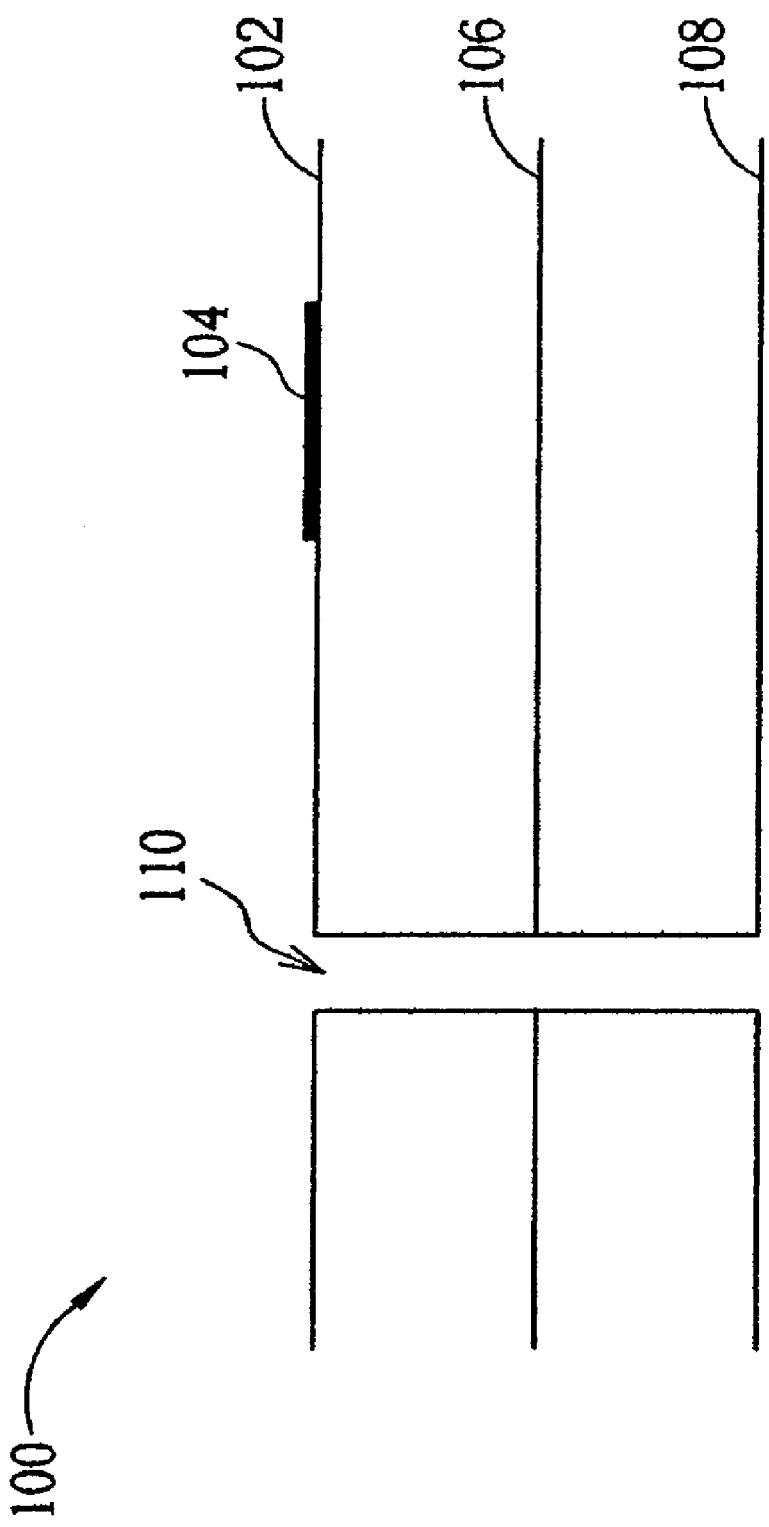
FIG. 7 illustrates various layers of the multi-layer printed circuit board 100.

Please refer to FIG.6 and FIG.7. FIG.6 is a diagram illustrating a computer system 80 containing a multi-layer printed circuit board 100 serving as a motherboard of the computer system 80. FIG.7 illustrates various layers of the multi-layer printed circuit board 100. The multi-layer printed circuit board 100 contains a signal plane 102 having trace regions 104 thereon, a power plane region 106, and a ground plane 108. In addition, an opening 110 is fanned in the multi-layer printed circuit board 100 for connecting the trace regions 104 with the power plane region 106 or the ground plane 108.

Figure 1:
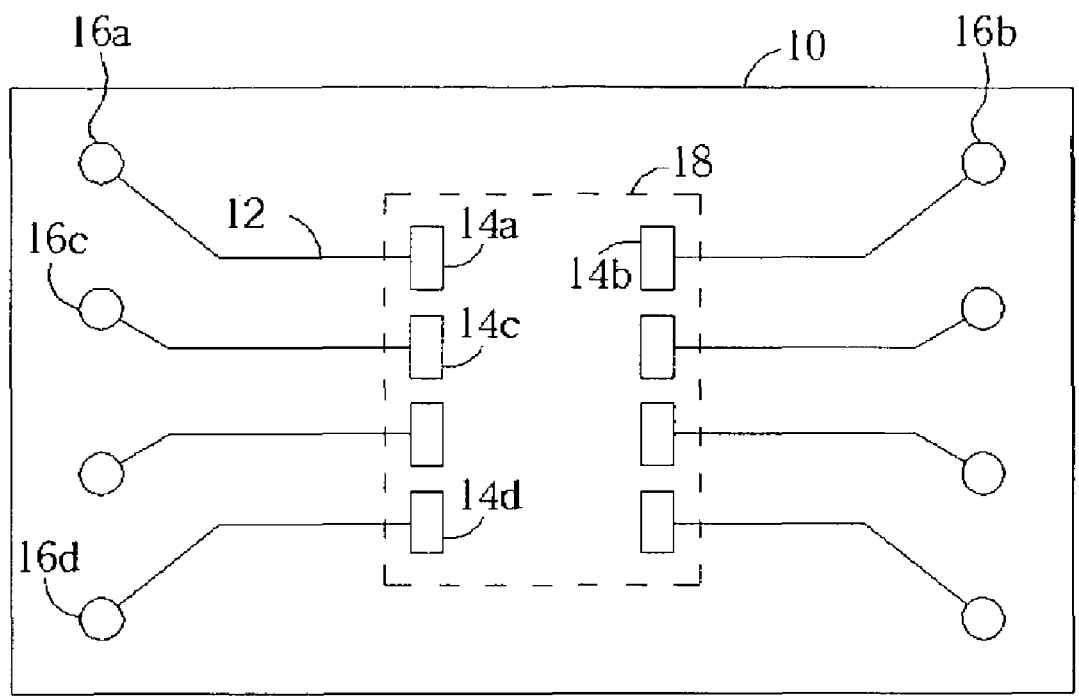
FIG. 1 is a diagram of a prior art signal plane of a multi-layer printed circuit board.
Figure 2:
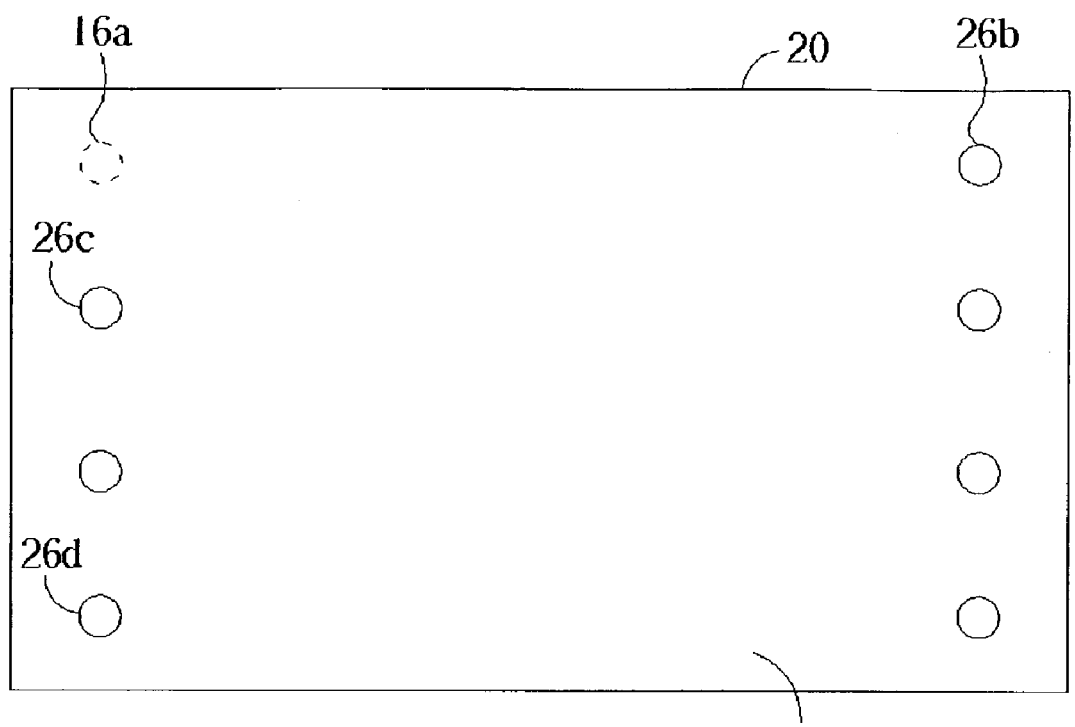
FIG. 2 is a diagram of a prior art ground plane of a multi-layer printed circuit board.
Figure 3:
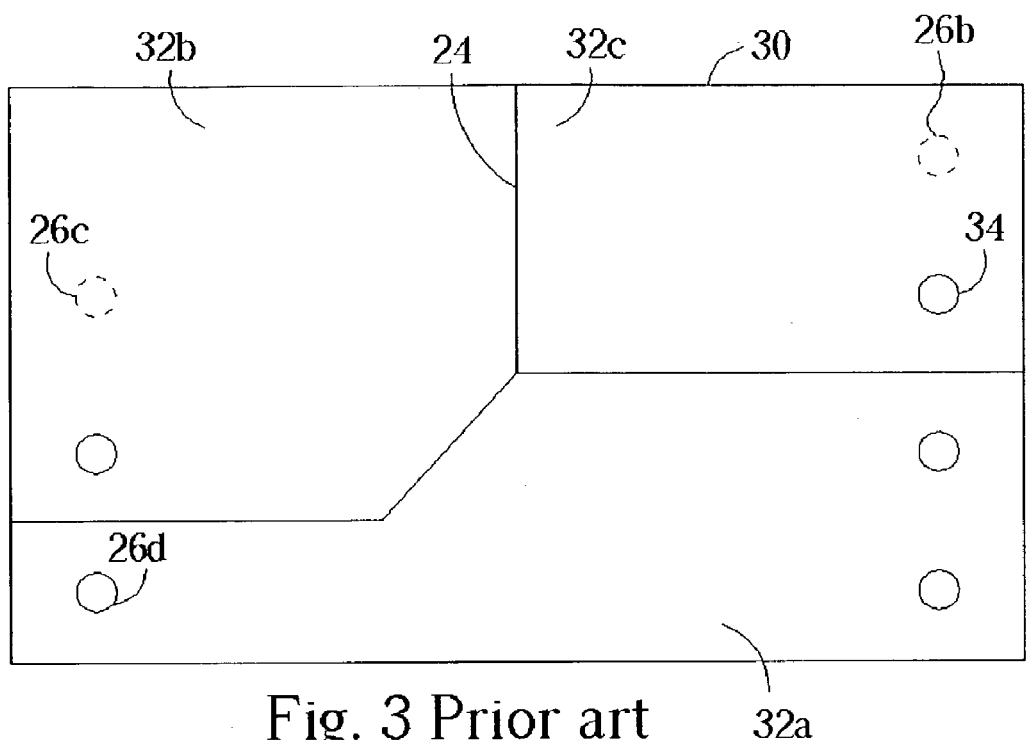
FIG. 3 is a diagram of a prior art power planeregion of a multi-layer printed circuit board.
Figure 4:
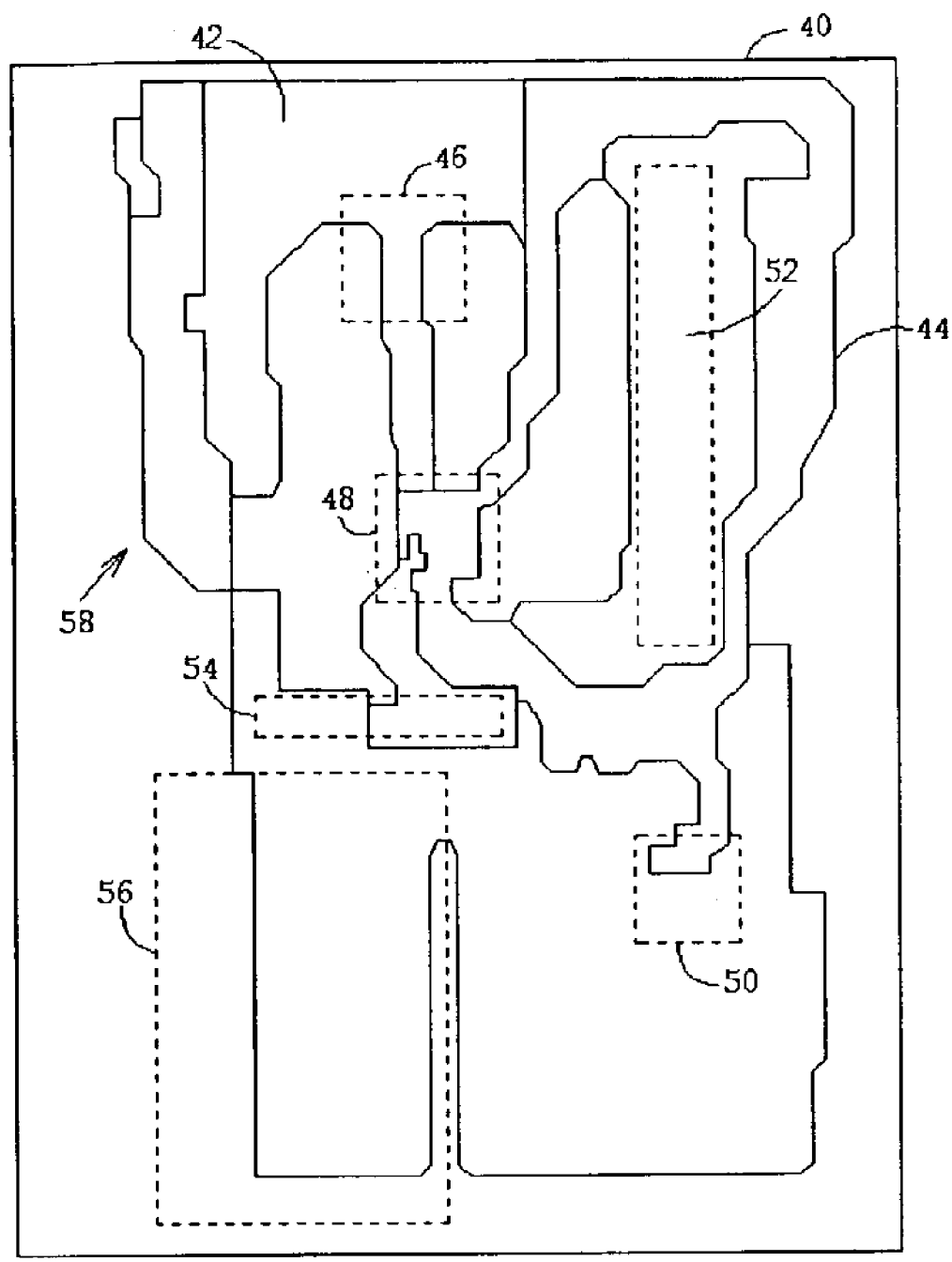
FIG. 4 is a diagram of a power plane region according to a first embodiment of the present invention.

Please refer to FIG. 4. FIG. 4 is a diagram of the power plane region 40 of a motherboard according to a first embodiment of the present invention. The teachings of the present invention can be applied to a DDR266 memory and a chipset of a motherboard. The power plane region 40 includes plural power blocks 42 and plural insulating lines 44. Each power block 42 is a conducting metal layer. The insulating lines 44 are non-conducting material and separate adjacent power blocks 42. Each power block 42 is used to provide a voltage level. Therefore, one insulating line 44 is disposed between two adjacent power blocks 42 with different voltage levels. Computer devices are mounted on the first signal plane (not shown). A CPU 46, a north bridge 48, a south bridge 50, a memory (SDRAM or DDR-RAM) 52, an accelerated graphics port (AGP) 54, a peripheral component interconnect (PCI) 56 receive working voltages from the power plane region 40. The insulating lines 44 can be considered as boundaries of the power blocks 42. Because the insulating lines 44 are not smooth curves at the turning points (according to the prior art), a boundary of adjacent power blocks 42 can have an acute angle. Because adjacent power blocks 42 provide different voltage levels, there is a dropout voltage among adjacent power blocks 42. Thus, at a boundary of adjacent the power blocks 42 there can appear a phenomenon of peak electrical discharge. This makes voltage levels of the power blocks 42 fluctuate. The power blocks 42 provide working voltages to the computer devices. When these working voltages are not stable, fluctuation of signals at the high and low levels affect stability of the system.

Figure 5:
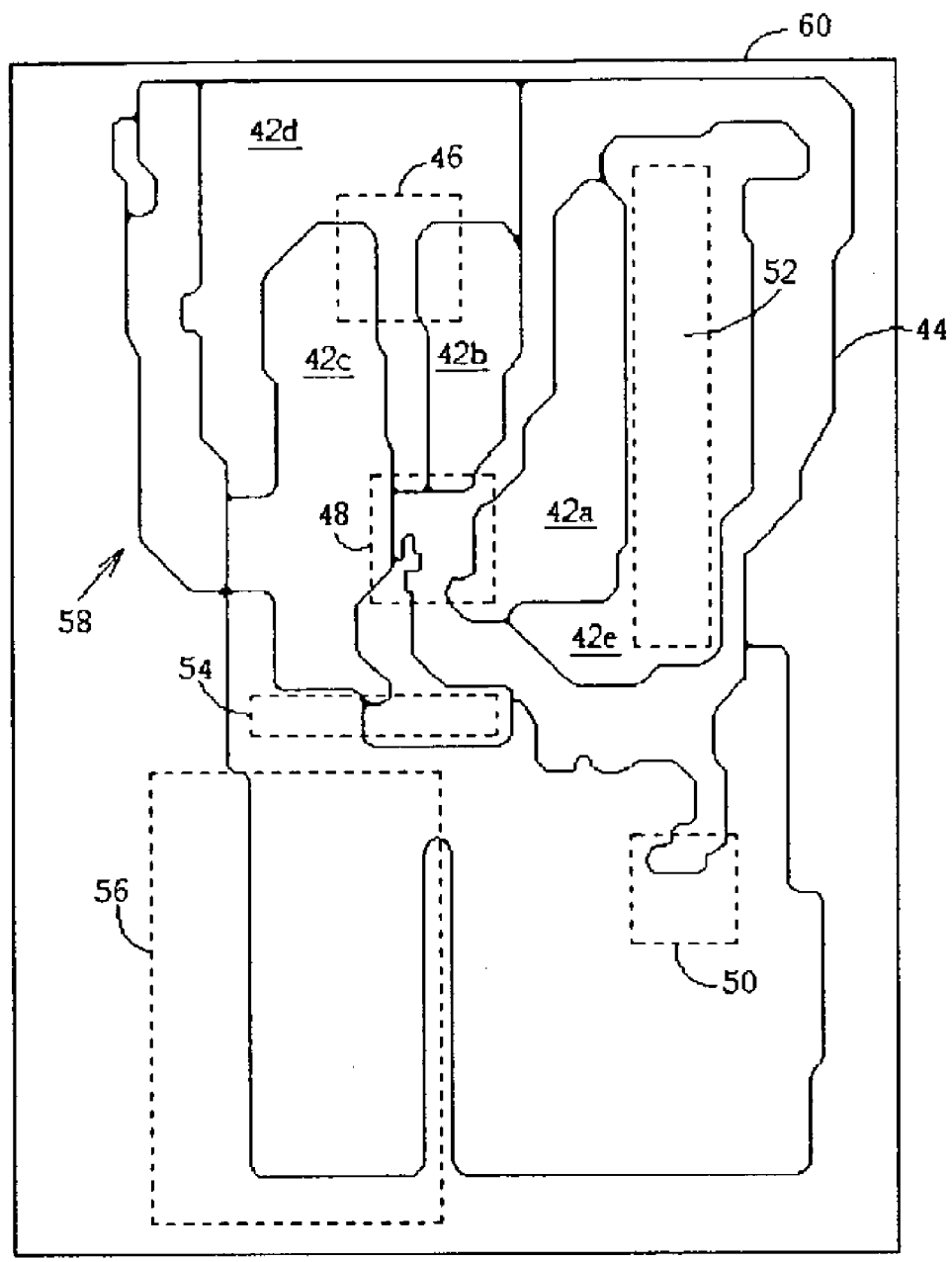
FIG. 5 is a diagram of a power plane region according to a second embodiment of the present invention.

The purpose of the present invention is to provide a kind of power plane region with power blocks having an arc-shaped boundary to reduce electrical noise over the prior art. FIG. 5 is a diagram of a power plane region according to a second embodiment of the present invention.

The present invention provides a kind of a multi-layer printed circuit board that includes at least a ground plane for providing a ground reference level, at least a signal plane having a plurality of trace regions for transmitting signals, at least a power plane region having a plurality of power blocks for individually providing a plurality of voltage levels, and at least a via (or called an opening) for electrically connecting the trace regions with the power plane region or the ground plane. Two adjacent power blocks with different voltage levels are separated by an insulating line. The insulating line has a plurality of first line segments, and a plurality of second line segments for connecting two adjacent first line segments when an included angle of the adjacent first line segments is greater than a predetermined value.

FIG.5 is a diagram of a power plane region 60 according to the second embodiment of the present invention. Positions of the power blocks 42 on the power plane region 60 are the same as with the power plane region 40 of FIG.4. The power plane region 60 is applied to a multi-layer printed circuit board such as a motherboard of a computer system. The power blocks 42a, 42b, 42c are ground reference levels and correspond to the north bridge chipset 48. Accordingly, vias (not shown) of corresponding north bridge chipset 48 contacts connect with the power blocks 42a, 42b, 42c. The power block 42d connects to vias (not shown) to provide $V_{core}$ to the CPU 46 and the power block 42e connects to vias (not shown) to provide $V_{dimm}$ to double data rate dynamic random access memory (DDR DRAM) 52. The major difference between the power plane region 60 and the power plane region 40 is the shape of the insulating lines 44. According to the second embodiment, the insulating lines 44 are made up of smooth segments. That is, smooth corner segments exist between two given straight segments. Each turning point (vertex) shown in FIG.4 is smoothly connected as shown in FIG.5. According to the second embodiment, adjacent power blocks 42a–42e do not include any acute angles and smooth curves reduce the phenomenon of fluctuating voltage levels caused by peak electrical discharge among the power blocks 42a–42e. For example, the power block 42d provides $V_{core}$ (for example 3.3 V) to the CPU 46. Power blocks 42c and 42b are ground reference levels. The insulating lines 44 shared between the power block 42d and the power blocks 42c and 42b are smooth segments. A boundary of the power block 42d with the power blocks 42c and 42d does not have an acute angle and there is reduced peak electrical discharge. Thus, the voltage of power block 42d does not significantly fluctuate around 3.3 V and the CPU 46 can function stably.

Compared with prior art, the insulating lines of the power blocks are smoothly connected at the turning points according to the present invention. Adjacent straight segments are connected by smooth curve segments. Thus, adjacent straight segments do not have a sharp angle. As power blocks bounded by insulating lines do not have any acute angles, unstable voltage levels caused by providing different voltage levels to adjacent power blocks can be avoided.

In contrast to the prior art, the present invention power plane region with power blocks having an arc-shaped boundary can increase stability of power on the power plane region so that electrical devices can have stable working voltages on the signal plane.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A multi-layer printed circuit board of a computer system that comprises a north bridge chipset, the multi-layer printed circuit board comprising:
    a ground plane for providing a ground reference level;
    a signal plane comprising a plurality of trace regions that are conductors for transmitting signals;
    a power plane region comprising a plurality of power blocks for providing a plurality of voltage levels, wherein an insulating line is disposed between two adjacent power blocks with different voltage levels, the insulating line comprising a plurality of first line segments, wherein the plurality of power blocks comprises three ground blocks for electrically connecting to the north bridge chipset and a first power block adjacent to the three ground blocks for providing a positive voltage, the three ground blocks and the first power block being located on a single layer of the multi-layer printed circuit board; and
    an opening for electrically connecting the trace regions with the power plane region or the ground plane.

2. The multi-layer printed circuit board of claim 1 wherein the insulating line positioned on the power plane region further comprises a plurality of second line segments that are smooth curves for connecting adjacent first line segments whose included angle is greater than a predetermined angle.

3. The multi-layer printed circuit board of claim 1 being a motherboard of the computer system.

4. The multi-layer printed circuit board of claim 3 wherein the three ground blocks positioned on the power plane region are used for providing a ground reference level.

5. The multi-layer printed circuit board of claim 4 wherein the three ground blocks are electrically connected to the opening related to the north bridge chipset.

6. The multi-layer printed circuit board of claim 4 wherein the positive voltage has a value of 2.5 volts.

7. The multi-layer printed circuit board of claim 4 wherein the power plane region further comprises a second power block power block and one of the ground blocks for providing of the computer system with a corresponding operating voltage ($V_{dimm}$).

8. The multi-layer printed circuit board of claim 7 wherein the power plane region further comprises a third power block adjacent to the first power block and two of the ground blocks for providing a central processing unit (CPU) of the computer system with a corresponding operating voltage ($V_{core}$).

9. A power plane region of a multi-layer printed circuit board for providing a plurality of voltage levels, the multi-layer printed circuit board further comprising at least a ground plane for providing a ground reference level, at least a signal plane comprising a plurality of trace regions that are conductors for transmitting signals, and at least an opening for electrically connecting the trace regions with the power plane region or the ground plane, the power plane region comprising:
    a plurality of power blocks for providing the voltage levels, wherein the plurality of power blocks comprises three ground blocks for providing a ground reference level and a first power block adjacent to the three ground blocks for providing a positive voltage level, the three ground blocks and the first power block being located on a single layer of the multi-layer printed circuit board; and
    at least an insulating line positioned between two adjacent power blocks with different voltage levels, the insulating line comprising a plurality of first line segments and a plurality of second line segments that are smooth curves;
    wherein when an included angle of two adjacent first line segments is greater than a predetermined angle, the two adjacent first line segments are connected by the second line segment.

10. The power plane region of claim 9 wherein the first line segment is a straight line.

11. The power plane region of claim 9 wherein the multi-layer printed circuit board is a motherboard of a computer system.

12. The power plane region of claim 9 wherein the three ground blocks are electrically connected to the opening related to a north bridge chipset of the computer system.

13. The power plane region of claim 9 wherein the positive voltage level has a value of 2.5 volts.

14. The power plane region of claim 9 further comprising a second power block adjacent to the first power block and one of the ground blocks for providing a memory of the computer system with a corresponding operating voltage ($V_{dimm}$).

15. The power plane region of claim 9 further comprising a second power block adjacent to the first power block and two of the ground blocks for providing a central processing unit (CPU) with a corresponding operating voltage ($V_{core}$).

16. The power plane region of claim 14 wherein the memory is a double data rate dynamic random access (DDR) memory.

17. A computer system comprising a multi-layer printed circuit board, the multi-layer printed circuit board comprising:

a north bridge chipset;

at least a ground plane for providing a ground reference level;

at least a signal plane comprising a plurality of trace regions that are conductors for transmitting signals;

at least a power plane region comprising a plurality of power blocks for providing a plurality of voltage levels, two adjacent power blocks with different voltage levels being separated by an insulating line, the insulating line comprising a plurality of first line segments and a plurality of second line segments that are smooth curves, the power blocks at least comprising three ground blocks for electrically connecting to the north bridge chipset and a first power block adjacent to the three ground blocks for providing a positive voltage, the three ground blocks and the first power block being located on a single layer of the multi-layer printed circuit board; and at least an opening for electrically connecting the trace regions positioned on the signal plane with the power plane region or the ground plane;

wherein when an included angle of two adjacent first line segments is greater than a predetermined angle, the two adjacent first line segments are connected by the second line segment.

18. The computer system of claim 17 wherein the power plane region further comprises a second power block adjacent to the first power block and one of the ground power blocks for providing a memory of the computer system with a corresponding operating voltage ($V_{dimm}$).

19. The computer system of claim 18 wherein the power plane region further comprises a third power block adjacent to the first power block and two of the ground blocks for providing a central processing unit (CPU) with a corresponding operating voltage ($V_{core}$).

* * * * *